US012074051B2

United States Patent
Lee et al.

(10) Patent No.: US 12,074,051 B2
(45) Date of Patent: Aug. 27, 2024

(54) TEACHING APPARATUS AND SUBSTRATE ALIGNMENT APPARATUS USING THE SAME

(71) Applicant: Samsung Electronics Co., Ltd., Suwon-si (KR)

(72) Inventors: Taehyoung Lee, Suwon-si (KR); Hohyun Lee, Hwaseong-si (KR); Jongmin Song, Seoul (KR); Young Yoon, Hwaseong-si (KR); Jaemoo Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 323 days.

(21) Appl. No.: 17/713,541

(22) Filed: Apr. 5, 2022

(65) Prior Publication Data
US 2023/0064941 A1   Mar. 2, 2023

(30) Foreign Application Priority Data

Aug. 27, 2021  (KR) .................. 10-2021-0114082

(51) Int. Cl.
  *H01L 21/683*   (2006.01)
  *B25J 9/16*   (2006.01)
  (Continued)

(52) U.S. Cl.
  CPC ........ *H01L 21/6833* (2013.01); *B25J 9/1679* (2013.01); *B25J 9/1697* (2013.01); *H01L 21/67259* (2013.01); *H01L 21/67742* (2013.01)

(58) Field of Classification Search
  CPC ............ H01L 21/67259; H01L 21/681; H01L 21/67748; H01L 21/6831; H01L 21/67742; H01L 21/6833; B25J 9/1697; B25J 9/1679
  (Continued)

(56) References Cited

U.S. PATENT DOCUMENTS

2003/0198376 A1   10/2003   Sadighi et al.
2009/0279989 A1   11/2009   Wong et al.
(Continued)

FOREIGN PATENT DOCUMENTS

JP   2014-128855 A   7/2014
KR   2004104421 A  * 12/2004  ......... B05B 13/0228
(Continued)

OTHER PUBLICATIONS

Machine translation of Douki et al. Korean Patent Document KR 2004-0104421 A Dec. 2004 (Year: 2004).*

Primary Examiner — Kevin J Comber
(74) Attorney, Agent, or Firm — Harness, Dickey & Pierce, P.L.C.

(57) ABSTRACT

A teaching apparatus includes a chamber; an electrostatic chuck in the chamber, the electrostatic chuck including a sidewall surrounding a loading area; an aligner configured to be loaded onto the loading area of the electrostatic chuck; a vision sensor configured to obtain measurement data by measuring separation distances of separation regions between the aligner and the sidewall of the electrostatic chuck and to transmit the measurement data; a transfer robot configured to load the aligner onto a reference position of the loading area and to position the vision sensor above the electrostatic chuck; and controller configured to reset the reference position and to equalize the separation distances based on the measurement data transmitted from the vision sensor.

20 Claims, 16 Drawing Sheets

(51) Int. Cl.
*H01L 21/67* (2006.01)
*H01L 21/677* (2006.01)
(58) Field of Classification Search
USPC .......................................... 361/234
See application file for complete search history.

(56) References Cited

U.S. PATENT DOCUMENTS

| | | |
|---|---|---|
| 2010/0171966 A1 | 7/2010 | Yamamoto et al. |
| 2016/0078612 A1 | 3/2016 | Kodama |
| 2019/0172742 A1 | 6/2019 | Mochizuki |
| 2019/0325601 A1* | 10/2019 | Chen .................. G06T 7/80 |
| 2021/0082729 A1 | 3/2021 | Hansen |
| 2021/0271161 A1* | 9/2021 | Roy .................. G03F 7/0002 |

FOREIGN PATENT DOCUMENTS

| | | |
|---|---|---|
| KR | 10-2009-0026335 A | 3/2009 |
| KR | 10-2009-0045504 A | 5/2009 |
| KR | 10-2010-0082312 A | 7/2010 |
| KR | 10-2012-0077881 A | 7/2012 |
| KR | 10-2013-0125158 A | 11/2013 |
| KR | 10-2016-0033048 A | 3/2016 |
| KR | 10-2019-0067105 A | 6/2019 |
| KR | 10-2021-0031805 A | 3/2021 |

* cited by examiner

TEACHING APPARATUS AND SUBSTRATE ALIGNMENT APPARATUS USING THE SAME

CROSS-REFERENCE TO RELATED APPLICATION(S)

This application claims the benefit under 35 USC 119(a) of Korean Patent Application No. 10-2021-0114082 filed on Aug. 27, 2021 in the Korean Intellectual Property Office, the entire disclosure of which is incorporated herein by reference for all purposes.

BACKGROUND

The present inventive concepts relate to a teaching apparatus and a substrate alignment apparatus using the same.

Semiconductor devices are widely used in the electronics industry due to the characteristics of the semiconductor devices, such as related to miniaturization, multifunctionality, and/or low manufacturing costs. The semiconductor devices may be manufactured by various manufacturing processes such as a photolithography process, an etching process, a deposition process, an ion implantation process, and a cleaning process.

These manufacturing processes may be performed by disposing the substrate in a process chamber. However, the positions of components inside the process chamber may be changed in the process of preparing the process chamber (e.g., before performing the manufacturing processes). Variations in the location of components may affect the process conditions of the manufacturing processes. Accordingly, various studies are being conducted for precisely examining minute position changes of components in the process chamber and reflecting the examination results in order to mount the substrate at a target position in the process chamber.

SUMMARY

Some example embodiments provide a teaching apparatus configured to re-adjust a reference position of a transfer robot by reflecting minute changes in the positions of the parts in a process chamber.

Some example embodiments provide a substrate alignment apparatus configured to seat a substrate in a target position in a process chamber.

According to some example embodiments, a teaching apparatus includes a chamber; an electrostatic chuck in the chamber, the electrostatic chuck including a sidewall surrounding a loading area; an aligner configured to be loaded onto the loading area of the electrostatic chuck; a vision sensor configured to obtain measurement data by measuring separation distances of separation regions between the aligner and the sidewall of the electrostatic chuck and to transmit the measurement data; a transfer robot configured to load the aligner onto a reference position of the loading area and to position the vision sensor above the electrostatic chuck; and controller configured to reset the reference position and to equalize the separation distances based on the measurement data transmitted from the vision sensor.

According to some example embodiments, a teaching apparatus includes a substrate support assembly, the substrate support assembly including a sidewall surrounding a loading area; an aligner configured to be loaded onto the loading area; a vision sensor configured to obtain measurement data by measuring separation distances between the aligner and the sidewall of the substrate support assembly and to transmit the measurement data; transfer robot configured to load the aligner into the loading area and to position the vision sensor above the loading area; and a controller configured to correct a reference position of the transfer robot based on the measurement data transmitted from the vision sensor.

According to example embodiments, a substrate alignment apparatus includes a chamber including an interior space, the chamber configured to process a substrate in the interior space; a substrate support assembly in the interior space, the substrate support assembly including a sidewall surrounding a loading area; an aligner configured to be loaded onto the loading area; a vision sensor configured to obtain measurement data by measuring separation distances between the aligner and the sidewall and to transmit the measurement data; a transfer robot configured to load and unload the aligner, the vision sensor, and the substrate into and out of the interior space; and a controller configured to correct a reference position for the loading of the substrate into the loading area by teaching the transfer robot based on the measurement data transmitted from the vision sensor.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Figure 1:
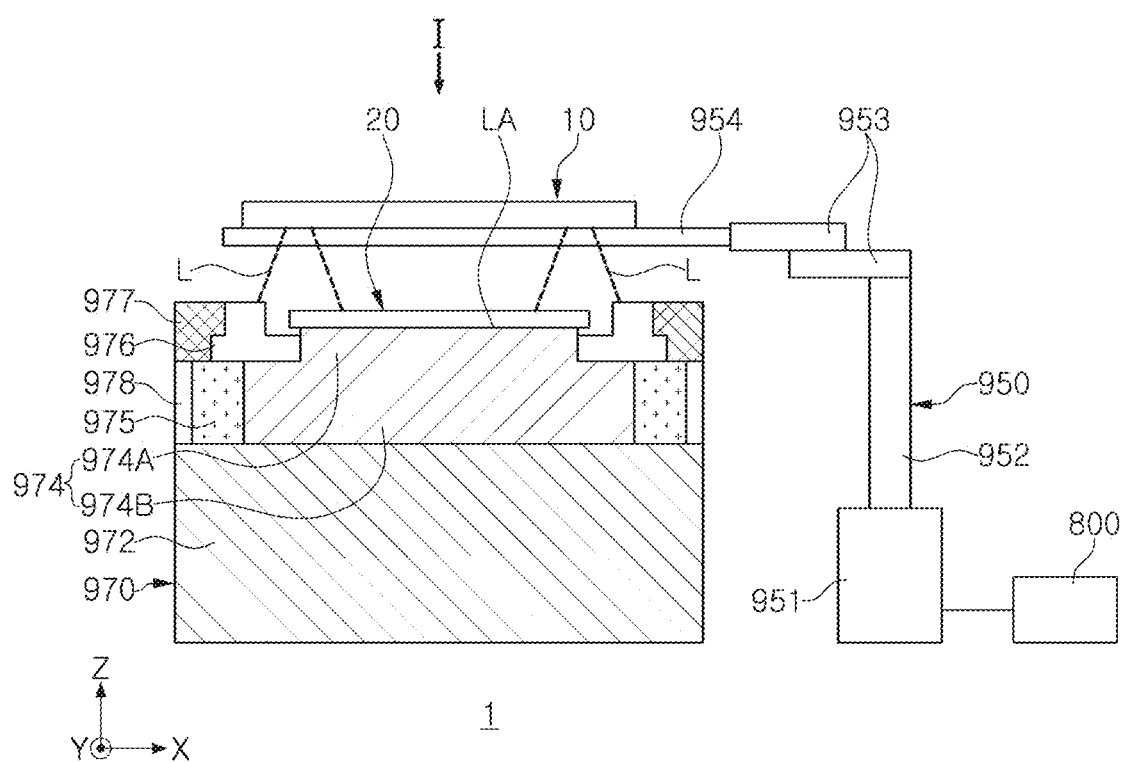
FIG. 1 is a schematic side view of a teaching apparatus according to some example embodiments.

Hereinafter, some example embodiments will be described with reference to the accompanying drawings, wherein like reference numerals refer to like elements throughout.

When the terms "about" or "substantially" are used in this specification in connection with a numerical value, it is intended that the associated numerical value includes a manufacturing or operational tolerance (e.g., ±10%) around the stated numerical value. Moreover, when "substantially" is used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 2:
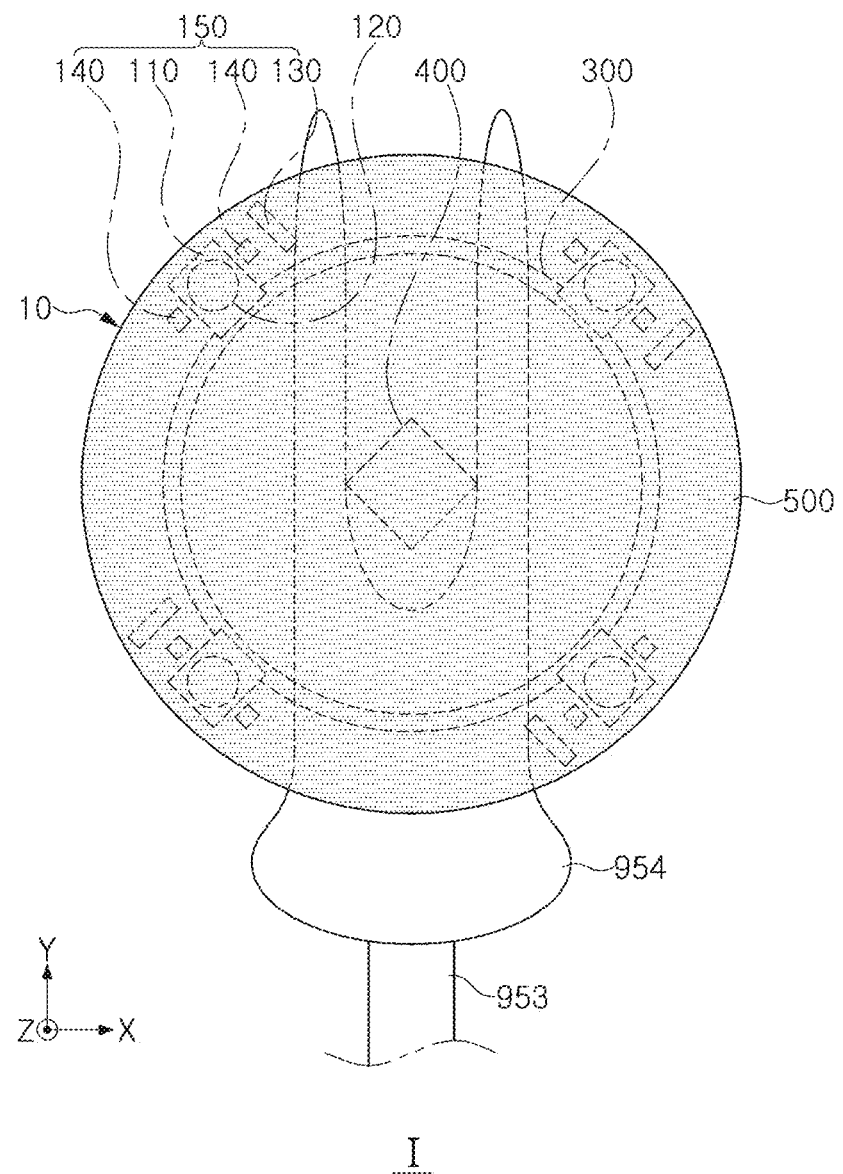
FIG. 2 is a plan view in which a vision sensor is loaded in a transport device of FIG. 1 as viewed in direction I of FIG. 1.
Figure 3:
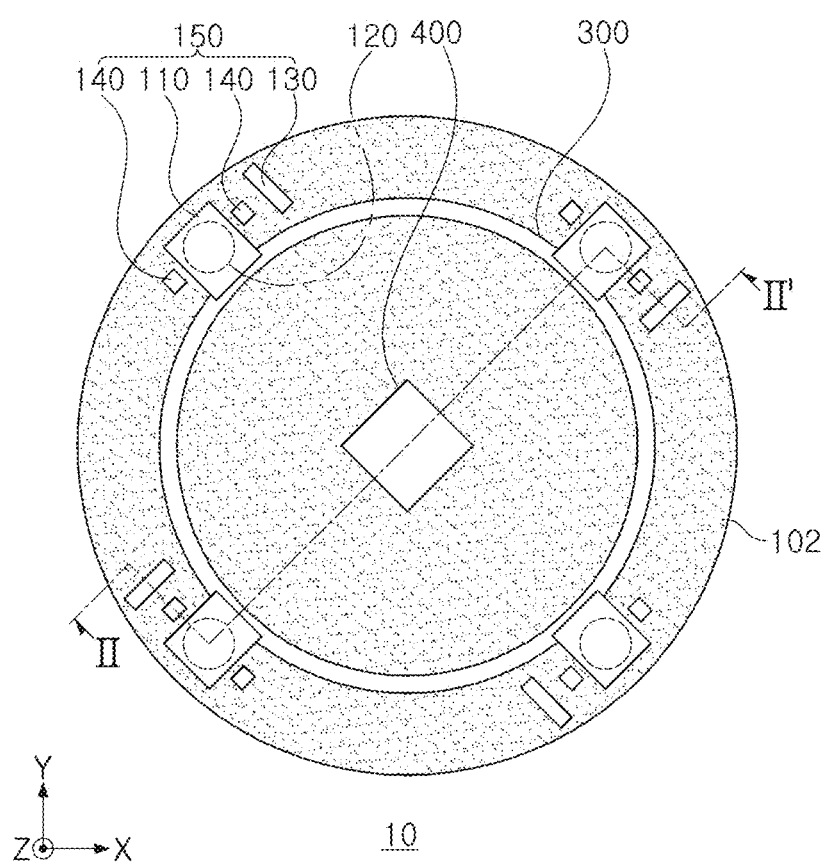
FIG. 3 is a front view of the vision sensor of FIG. 2.
Figure 4:
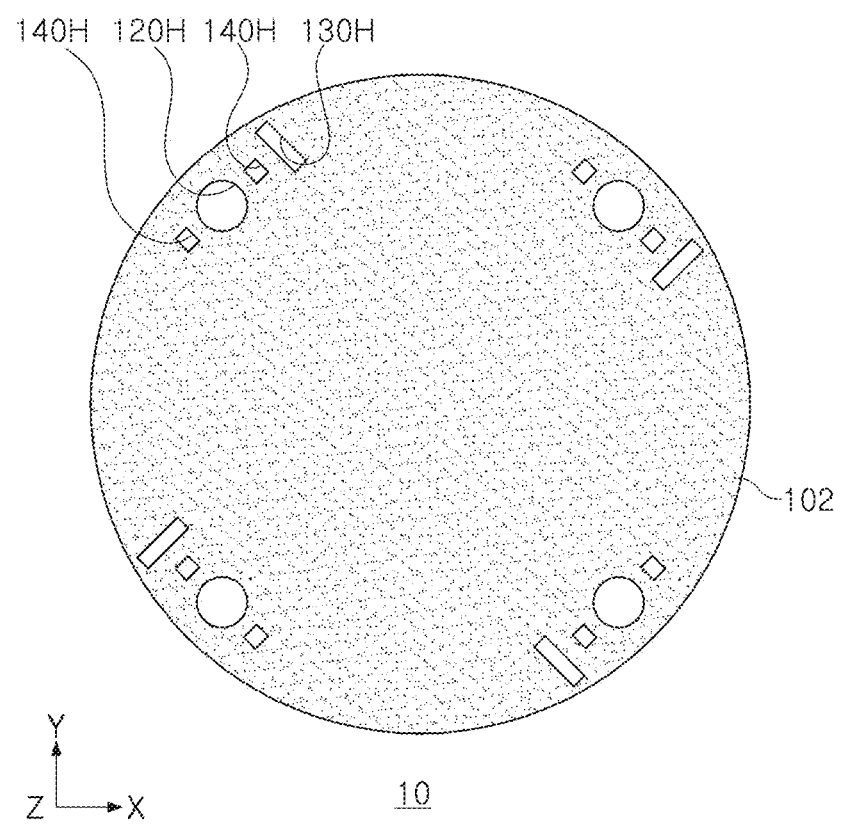
FIG. 4 is a rear view of the vision sensor of FIG. 2.
Figure 5:
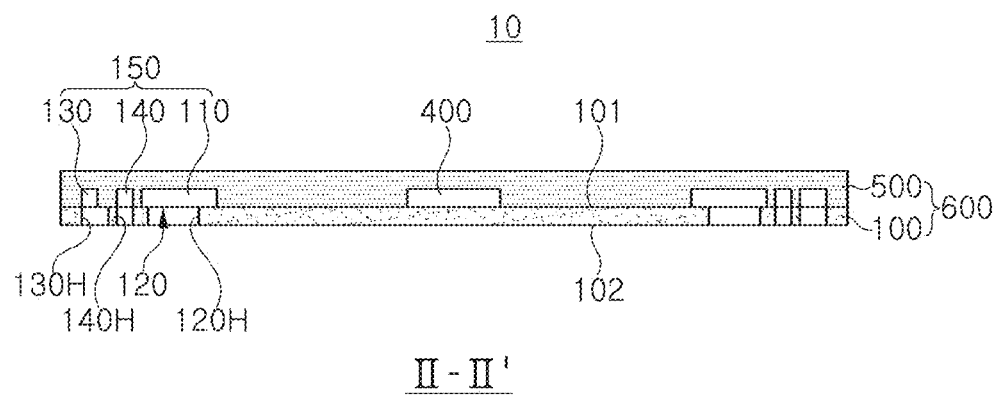
FIG. 5 is a cross-sectional view taken along line II-II' of FIG. 3.
Figure 6:
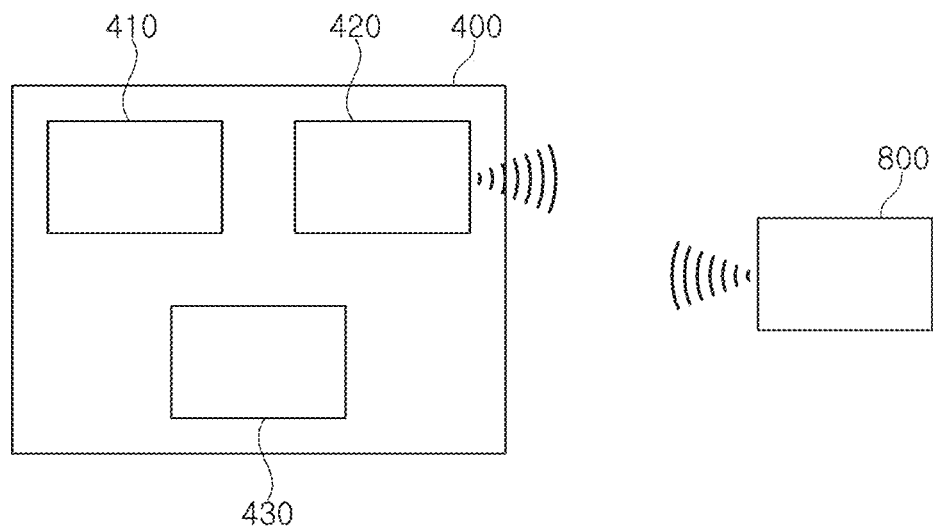
FIG. 6 provides conceptual diagrams of a circuit unit of FIG. 3 and a control unit of FIG. 2.
Figure 7A:
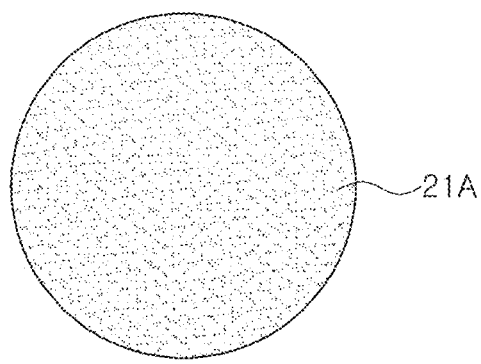
FIGS. 7A to 7C illustrate some example embodiments of the aligner of FIG. 1.
Figure 7B:
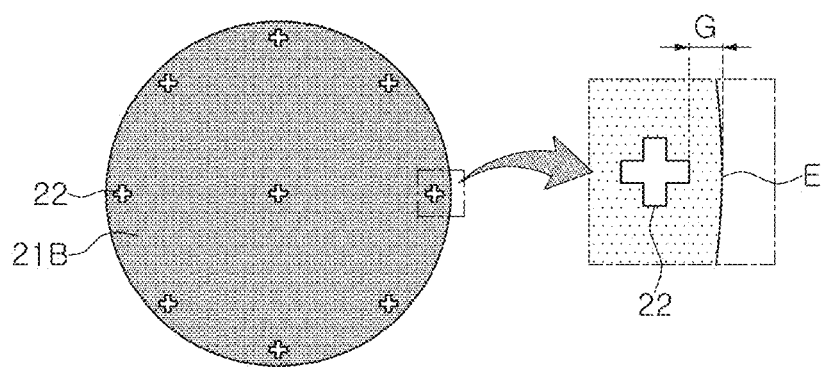
Figure 7C:
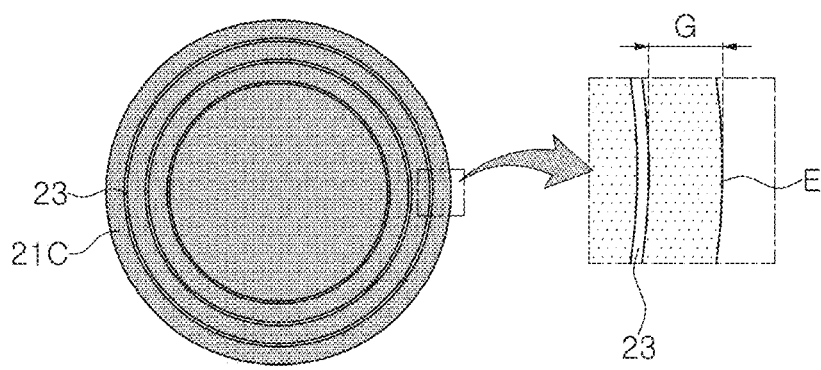

FIG. 1 is a schematic side view of a teaching apparatus according to some example embodiments, and FIG. 2 is a plan view viewed in direction I of FIG. 1 in which a vision sensor is loaded in a transfer apparatus of FIG. 1. FIG. 3 is a front view of the vision sensor of FIG. 2, and FIG. 4 is a rear view of the vision sensor of FIG. 2. FIG. 5 is a cross-sectional view taken along line II-II' of FIG. 3, and FIG. 6 provides conceptual diagrams of a circuit unit of FIG. 3 and a control unit of FIG. 2. FIGS. 7A to 7C illustrate various embodiments of the aligner 20 of FIG. 1. In FIG. 3, illustration of the cover member 500 illustrated in FIG. 5 is omitted.

Referring to FIG. 1, a teaching apparatus 1, according to some example embodiments, may include an electrostatic chuck 970, a transfer robot 950, an aligner 20, a vision sensor 10, and a control unit 800. As will be described below, the aligner 20 may be loaded onto the electrostatic chuck 970. The vision sensor 10 may be configured to be disposed above the aligner 20 loaded on the electrostatic chuck 970, and a separation distance between the sidewall of the electrostatic chuck 970 and the edge of the aligner 20 may be measured through the vision sensor 10. As will be described below, the operation of the transfer robot 950 may be corrected based on the measured separation distance, and thus, the transfer robot 950 may enable a semiconductor substrate to be disposed on a target position of the electrostatic chuck 970, e.g., in a subsequent process.

The electrostatic chuck 970 may include a base body 972 functioning as a lower electrode, a plate 974 attached to an upper surface of the base body 972 and including an electrode therein, an edge ring 975 surrounding the outer circumferential surface of the plate 974, a focus ring 976 disposed on the edge ring 975, and an insulation ring 977 surrounding the focus ring 976.

The plate 974 includes a loading area LA on which the aligner 20 may be seated. The loading area LA may be, e.g., on the upper surface of the plate, and the loading area LA of the plate 974 may be formed to have a circular shape. The shapes of an upper portion 974A and a lower portion 974B of the plate 974 may be different from each other. For example, the diameter of the lower portion 974B of the plate 974 may be greater than the diameter of the upper portion 974A. In this case, the side surface of the plate 974 may have a step difference. However, the example embodiments not limited thereto, and, e.g., the diameter of the upper portion 974A and the lower portion 974B of the plate 974 may be the same.

The focus ring 976 may have a ring shape surrounding the upper portion 974A of the plate 974. A portion of the focus ring 976 may surround the upper portion 974A of the plate 974 on which the aligner 20 is disposed.

A portion of the focus ring 976 may be disposed below the edge of the aligner 20 and may cover the side surface of the upper portion 974A of the plate 974. This will be described with reference to FIG. 8. A step may be formed on the inner surface of the focus ring 976. The inner surface may refer to a surface of the focus ring 976 nearest to the side surface of the upper portion 974A of the plate 974. For example, an upper surface of the focus ring 976 may include a first upper surface 976U1 and a second upper surface 976U2. The first upper surface 976U1 may be disposed at a level higher than the upper surface 21 of the aligner 20, and the second upper surface 976U2 may be disposed at a lower level than the upper surface 21 of the aligner 20. A sidewall 976S connecting the first upper surface 976U1 and the second upper surface 976U2 may be disposed to be spaced apart from the edge of the aligner 20 by a distance D.

Referring back to FIG. 1, the focus ring 976 may cover at least a portion of the upper surface of the lower portion 974B of the plate 974. The focus ring 976 may be formed of, for example, at least one of silicon (Si), silicon carbide (SiC), and/or quartz ($SiO_2$).

The edge ring 975 may have a ring shape surrounding the lower portion 974B of the plate 974. The edge ring 975 may be disposed below the focus ring 976 and the insulation ring 977 and may support the focus ring 976 and the insulation ring 977. The edge ring 975 may include a metallic material. For example, the edge ring 975 may include aluminum.

The insulation ring 977 may have a ring shape surrounding an outer edge of the focus ring 976. The insulation ring 977 may be configured to cover a remainder of an upper surface of the edge ring 975 not covered by the focus ring 976. The insulation ring 977 may include an insulating material. For example, the insulating ring 977 may include at least one of a ceramic, Si, SiC, and/or quartz.

The insulation ring 977 may be supported by a support ring 978. The support ring 978 may contact a portion of the lower surface of the insulation ring 977. As illustrated in FIG. 1, the support ring 978 may be disposed to surround an outer circumferential surface of the edge ring 975.

The base body 972 may be disposed below the plate 974, the edge ring 975, and the support ring 978. The base body 972 may include an insulating material, for example, a ceramic.

The transfer robot 950 may load the aligner 20 into the loading area LA of the electrostatic chuck 970 and/or unload the aligner 20 loaded on the electrostatic chuck 970. The transfer robot 950 may also load and/or unload, e.g., a semiconductor wafer on the electrostatic chuck 970 in a subsequent manufacturing process. Also, in some example embodiments, the transfer robot 950 may position the vision sensor 10 above the aligner 20.

The transfer robot 950 may have a multi-stage arm 953, and a hand 954 on which a load is loaded. The hand 954 may be disposed on an end of the arm 953. The arm 953 may be moved up and down by a driving shaft 952, and/or may be rotationally moved about the driving shaft 952 by the rotation of a driving unit 951. The operation of the transfer robot 950 may be controlled by the control unit 800. The control unit 800 may also be referred to as a controller. In some example embodiments, the load on the hand 954 of the transfer robot 950 may be the aligner 20 and the vision sensor 10. The transfer robot 950 may repeatedly position the load on (and/or at) the reference position of the loading area LA and/or dispose the load above the reference position, e.g., under the control of the control unit 800. For example, the transfer robot 950 may repeatedly load and/or unload the aligner 20 in the reference position of the loading area LA and may dispose the vision sensor 10 above the reference position.

The aligner 20 is provided to improve the identification of the target image acquired by the vision sensor 10. The aligner 20 may be seated on the loading area LA of the upper portion 974A of the plate 974. The aligner 20 may be formed of substantially the same shape and material as a semiconductor substrate used for forming an integrated circuit. For example, according to some embodiments, the aligner 20 may have a wafer shape. For example, the aligner 20 may have a wafer shape having a diameter between 200 mm and 300 mm (e.g., 200 mm or 300 mm). According to some example embodiments, the upper surface of the aligner 20 may be surface-treated or provided with a marker disposed thereon to easily recognize patterns projected by the vision sensor 10.

Some examples of upper surface 21 of the aligner 20 will be described with reference to FIGS. 7A to 7C, however the example embodiments are not limited thereto.

Referring to FIG. 7A, an upper surface 21A of the aligner 20A may be subjected to a blasting process. For example, if the reflectivity of the upper surface 21A of the aligner 20A is relatively too high, the laser light irradiated from the vision sensor 10 is reflected from the upper surface 21A of the aligner 20A, and the position of the aligner 20 may be difficult to be identified. For example, if the reflectivity of the upper surface 21A of the aligner 20A is too high the laser light may be mostly reflected at an angle oblique to the vision sensor 10. When the upper surface 21A of the aligner 20A is blasted, the reflectivity of the upper surface 21A may be reduced, and thus, the position of the aligner 20 may be easily identified through the vision sensor 10.

Referring to FIG. 7B, a cross-shaped marker 22 may be formed on the upper surface 21B of the aligner 20B. Referring to FIG. 7C, a circular marker 23 may be formed on the upper surface 21C of the aligner 20C. In this case, the value of an interval G between the markers 22 and 23 and an edge E of the aligner 20 may be (e.g., previously) stored in the control unit 800. Accordingly, the control unit 800 may identify the positions of the markers 22 and 23 and calculate the position of the edge E of the aligner 20 from the identified positions of the markers 22 and 23.

Referring again to FIGS. 1 and 2, the vision sensor 10 may be loaded on the hand 954 of the transfer robot 950 and disposed above the aligner 20. Referring to FIGS. 3, 4 and 5, the vision sensor 10 may include a support member 100. The support member 100 may have a wafer shape, but the shape thereof is not limited thereto. For example, the support member 100 may have various shapes, such as a wafer shape and/or a cross shape. The support member 100 may have a first surface 101 and a second surface 102 opposing each other, and may include a plurality of holes 120H, 130H, and 140H penetrating therethrough.

Figure 9:
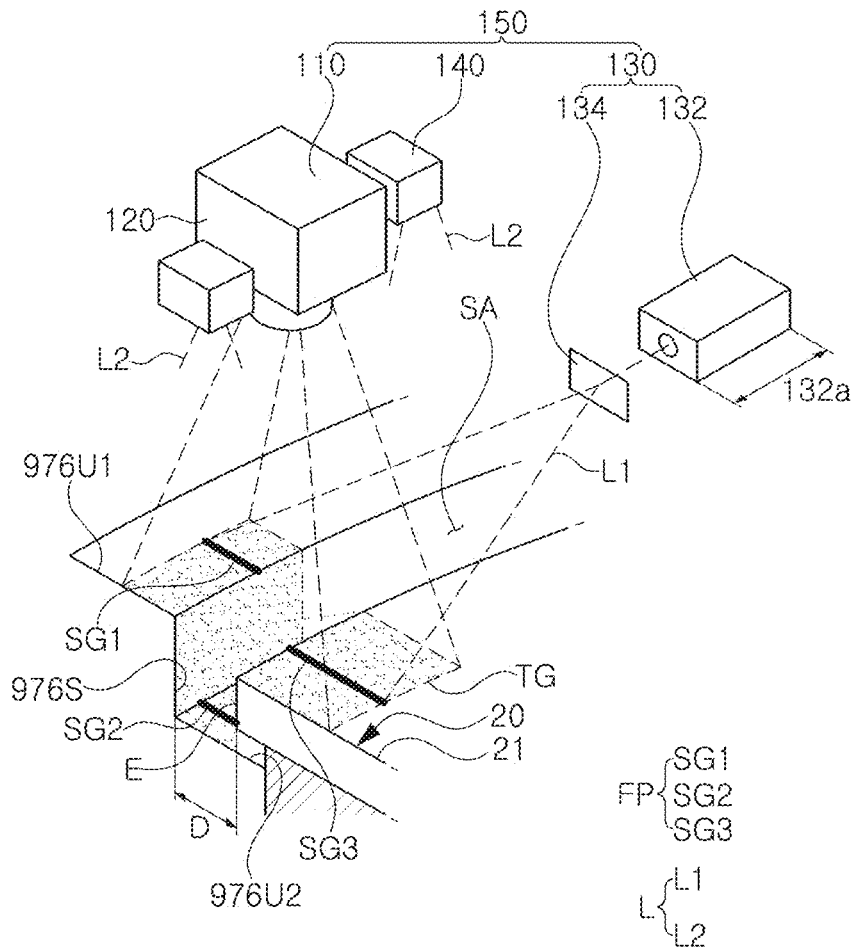
FIG. 9 is a conceptual diagram illustrating a method in which a vision sensor acquires a target image of a target.

Referring to FIGS. 5 and 9, the vision sensor 10 is for identifying a separation distance D between the edge E of the aligner 20 and the sidewall 976S of the focus ring 976. The vision sensor 10 may include an image scanning module 150 disposed on the first surface 101 of the support member 100. The image scanning module 150 is for acquiring an image of a target TG. The target TG may include, e.g., a partial region of the aligner 20, a partial region of the focus ring 976, and a separation region SA between the edge E of the aligner 20 and the sidewall 976S of the focus ring 976.

The image scanning module 150 may also be referred to as an image scanning assembly, and may include a camera 110, a first illuminator 130, and/or a second illuminator 140. The camera 110 may be disposed on the support member 100 such that a lens unit 120 of the camera 110 overlaps a corresponding hole 120H (e.g., among the plurality of holes 120H, 130H, and 140H). The lens unit 120 may also be referred to as a lens assembly. The camera 110 may be configured to scan an image of the target TG through the corresponding hole 120H. The first illuminator 130 may be disposed on the support member 100 to overlap a corresponding hole 130H (e.g., among the plurality of holes 120H, 130H, and 140H). The first illuminator 130 may be configured to project a pattern (e.g., a fringe pattern) onto the target TG through the corresponding hole 130H. The second illuminator 140 may be disposed on the support member 100 to overlap a corresponding hole 140H (e.g., among the plurality of holes 120H, 130H, and 140H). The second illuminator 140 may be configured to irradiate visible light onto the target TG through the corresponding hole 140H. According to some example embodiments, the second illuminator 140 may be omitted.

Referring to FIG. 3, the image scanning module 150 may be provided as a plurality of image scanning modules. In this case, the plurality of image scanning modules 150 may be disposed on the first surface 101 of the support member 100, to be spaced apart from each other. For example, the plurality of image scanning modules 150 may be arranged to be spaced apart from each other at equal intervals along the edge of the support member 100. A fixing member 300 may be provided on the first surface 101 of the support member 100, and the plurality of image scanning modules 150 may be coupled to the fixing member 300. The plurality of image scanning modules 150 may be fixed on the support member 100 by the fixing member 300, but the example embodiments are not limited thereto. According to some example embodiment, the fixing member 300 may be omitted. FIG. 3 illustrates that four image scanning modules 150 are disposed at equal intervals on the support member 100, but the example embodiments are not limited thereto. According to some example embodiments, three, five, and/or more image scanning modules 150 may be disposed on the support member 100 at equal intervals.

Referring to FIGS. 3, 5, and 6, the vision sensor 10 may include a circuit unit 400 disposed on the first surface 101 of the support member 100. For example, the circuit unit 400 may be disposed on a central portion of the support member 100, but the position thereof is not limited thereto. The circuit unit 400 may include a processor 410 processing various data, a wireless communication module 420 that transmits various data processed by the processor 410 to an external device (such as the control unit 800) and transmits various data provided from the external device to the processor 410, and/or a battery module 430 supplying power to the vision sensor 10. The circuit unit 400 may also be referred to as a control system. The processor 410, the wireless communication module 420, and the battery module 430 may be coupled to each other through a data bus. The processor 410 may receive the image of the target TG from the image scanning module 150 and may generate data based on the received image. The wireless communication module 420 may transmit the data generated by the processor 410 to the control unit 800. The wireless communication module 420 may, for example, be configured to communicate with the control unit 800 using a near field communication method. For example, the near field communication method may include at least one of Bluetooth, wireless fidelity (WiFi) direct, and infrared data association (IrDA), and/or the like. The wireless communication module 420 may also be referred to as a wireless communication interface. Though illustrated as being incorporated in a single unit, the example embodiments are not limited thereto, and the processor 410, the wireless communication module 420, and the battery module 430 may be, for example, together and/or separately.

Referring back to FIGS. 3, 4, and 5, the vision sensor 10 may include a cover member 500 disposed on the first surface 101 of the support member 100. The cover member 500 may cover the first surface 101 of the support member 100, and may cover the image scanning module 150, the fixing member 300, and the circuit unit 400. The support member 100 and the cover member 500 may constitute the housing 600, and the image scanning module 150, the fixing member 300, and the circuit unit 400 may be provided inside of the housing 600. The housing 600 may have a wafer shape, but the example embodiments are not limited thereto. For example, the housing 600 may have various shapes, such as a wafer shape and/or a cross shape. According to some example embodiments, the housing 600 may have a wafer shape having a diameter greater than that of a semiconductor substrate used for forming a semiconductor integrated circuit.

Figure 8:
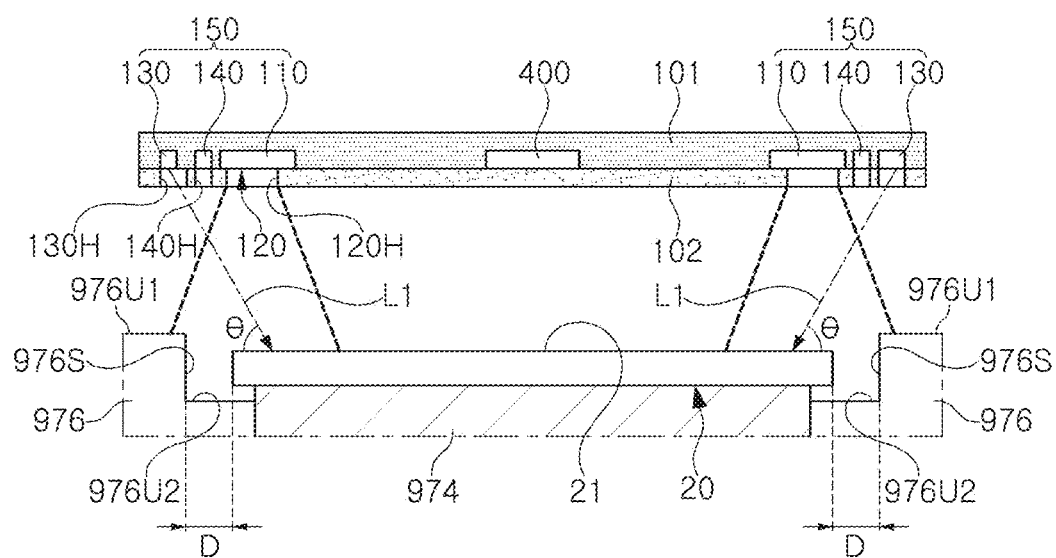
FIG. 8 is a conceptual diagram illustrating an operation of an image scanning module.
Figure 10:
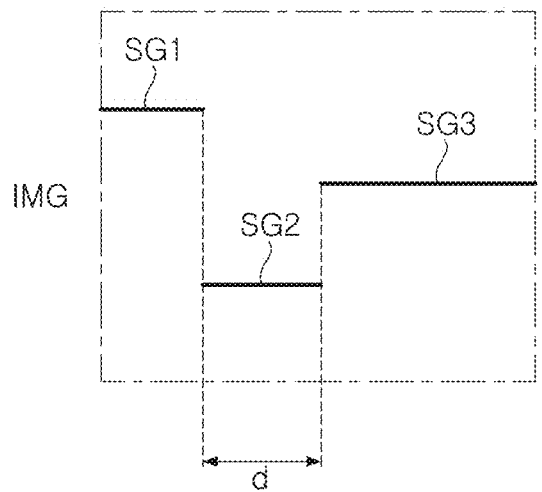
FIG. 10 is a target image acquired by the vision sensor in FIG. 9.

FIG. 8 is a conceptual diagram illustrating an operation of an image scanning module, and FIG. 9 is a conceptual diagram illustrating a method in which a vision sensor acquires the target image of the target TG. FIG. 10 is the target image acquired by the vision sensor in FIG. 9.

Referring to FIGS. 8 and 9, the vision sensor 10 may be disposed above the aligner 20. The first illuminator 130 of the image scanning module 150 may irradiate first light L1 on the edge of the aligner 20 through the corresponding hole 130H. The first light L1 may be irradiated to be inclined at an angle θ with respect to the target TG, and a pattern (e.g., a fringe pattern) may be projected on the target TG by the first light L1. The first light L1 may be, for example, laser light. The camera 110 of the image scanning module 150 may scan an image of the target TG on which the pattern (e.g., the fringe pattern) is projected. Accordingly, a first target image of the target may be acquired by the image scanning module 150.

The first target image acquired by the image scanning module 150 may be transmitted to the circuit unit 400. For example, the processor 410 of FIG. 6 may receive the first target image from the image scanning module 150 and may process the first target image to generate data (hereinafter, 'measurement data') based on the first target image. The processor 410 may generate a three-dimensional model of the target TG based on the first target image and may generate measurement data including the separation distance D between the edge E of the aligner 20 and the sidewall 976S of the focus ring 976 based on the generated three-dimensional model. The measurement data generated by the processor 410 may be transmitted to the control unit 800 through the wireless communication module 420 of FIG. 6.

Referring to FIGS. 8, 9, and 10, the first illuminator 130 of the image scanning module 150 may include a laser light source 132, and an optical member 134 controlling the optical path of the first light L1 (e.g., the laser light) emitted from the laser light source 132. The laser light source 132 may be disposed such that a long axis 132a thereof is parallel to the first surface 101 of the support member 100. The optical member 134 may control the light path of the first light L1 such that the first light L1 is irradiated to be inclined at an angle θ with respect to the surface of the target TG through the corresponding hole 130H. In some example embodiments, for example, the optical member 134 may include a mirror and/or prism configured to adjust the angle θ. In some example embodiment, the optical member may be connected to, e.g., an actuator to adjust the angle θ. A pattern FP (e.g., a fringe pattern) may be projected on the target TG by the first light L1. The camera 110 of the image scanning module 150 may scan (e.g., capture) an image of the target TG onto which the pattern FP is projected, and accordingly, a first target image IMG of the target TG may be obtained. The pattern FP may be, for example, a fringe pattern having a line shape. Hereinafter, a case in which the pattern FP is a fringe pattern having a line shape will be described as an example, but the example embodiments are not limited thereto. For example, the pattern FP may be a fringe pattern having various shapes.

When the surface of the target TG is planar, the pattern FP may be projected on the surface of the target TG in the form of a single line. Accordingly, it can be seen that the portion illustrated in the form of a single line in the first target image is a plane.

In addition, as illustrated in FIGS. 9 and 10, when the surface of the target TG is formed of planes having different levels, the pattern FP may be divided into a plurality of segments according to the level of the surface and may be projected as illustrated in FIG. 10. For example, a first segment SG1 may be projected onto a portion of the first upper surface 976U1 of the focus ring 976, a second segment SG2 may be projected onto a portion of the second upper surface 976U2 of the focus ring 976, and a third segment SG3 may be projected onto a portion of the upper surface 21 of the aligner 20. Accordingly, when a length d of the second segment SG2 illustrated in FIG. 10 is measured, the separation distance D between the sidewall 976S of the focus ring 976 and the edge E of the aligner 20 may be calculated. The processor (410 of FIG. 6) analyzes the shape of the pattern FP included in the first target image IMG according to the above-described method, thereby calculating the separation distance D between the sidewall 976S of the focus ring 976 and the edge E of the aligner 20. The processor 410 may generate measurement data including the calculated separation distance D. When the image scanning module 150 is included in a plurality of image scanning modules 150, a number of measurement data corresponding to the number of image scanning modules 150 may be generated. The measurement data generated by the processor 410 may be transmitted to the control unit 800 through the wireless communication module 420 of FIG. 6.

The second illuminator 140 of the image scanning module 150 may include an LED light source. For example, the LED light source may emit second light L2 including, e.g., visible light. The second illuminator 140 may irradiate the second light L2 to the target TG of the aligner 20 through the corresponding hole 140H. The second light L2 may be irradiated with a wide beam angle to illuminate the target TG as a whole.

The camera 110 of the image scanning module 150 may scan an image of the target TG to which the second light L2 is irradiated. Accordingly, a second target image of the target may be acquired by the image scanning module 150. Unlike the first target image, the second target image may appear as an image obtained by scanning the entire surface of the target TG. For example, the second target image may be an image obtained by capturing the surface of the target.

The second target image may be acquired to calculate the separation distance D auxiliary when the separation distance D between the sidewall 976S of the focus ring 976 and the edge E of the aligner 20 cannot be calculated using only the first target image. For example, in a case in which the focus ring 976 is formed of a material (such as silicon (Si)) having relatively high reflectivity, the laser light (e.g., in the form of a line emitted from the first illuminator 130) is reflected from the surface of the focus ring 976 (e.g., reflected away from the image), and thus, the identification may be difficult using only the first target image. Therefore, the position of the sidewall 976S of the focus ring 976 cannot be identified only by the first target image, and the separation distance D between the sidewall 976S of the focus ring 976 and the edge E of the aligner 20 may be difficult to calculate. In these cases, by identifying the position of the sidewall 976S of the focus ring 976 through the second target image and referring to the edge E of the aligner 20 identified in the first target image, the separation distance D between the sidewall 976S of the focus ring 976 and the edge E of the aligner 20 may be calculated.

The second target image acquired by the image scanning module 150 may be transmitted to the circuit unit 400. For example, the processor 410 of FIG. 6 may receive the second target image from the image scanning module 150 and may image-process the second target image to extract a line edge corresponding to the sidewall 976S of the aligner 20.

The processor 410 may identify the position of the sidewall 976S of the focus ring 976 from the extracted line edge and may calculate the separation distance D between the sidewall 976S of the focus ring 976 and the edge E of the aligner 20 (e.g., based on the edge E of the aligner 20 data identified in the first target image).

The processor 410 may generate measurement data including the calculated separation distance D. When the image scanning module 150 is provided as a plurality of image scanning modules, a number of measurement data corresponding to the number of image scanning modules 150 may be generated. The measurement data generated by the processor 410 may be transmitted to the control unit 800 through the wireless communication module 420 of FIG. 6.

The control unit 800 is configured to control the overall operation of the teaching apparatus 1, and may be include (and/or be included in) a processor such as a central processing unit (CPU), a graphics processing unit (GPU), a microprocessor, an application specific integrated circuit (ASIC), Field Programmable Gate Arrays (FPGA), and/or the like, and may include a memory for storing various data used in and/or required for the operation of the teaching apparatus 1.

The control unit 800 may calculate an offset value for correcting a reference position of the loading area LA to a target position, based on the measurement data transmitted from the wireless communication module 420 included in the circuit unit 400 of the vision sensor 10, and may reset the reference position of the transfer robot 950 based on the calculated offset value. For example, when a plurality of measurement data is transmitted, the offset value may include a control value for moving the hand 954 of the transfer robot 950 such that the plurality of separation distances D between the sidewall 976S of the focus ring 976 and the edge E of the aligner 20 are all equal. The control unit 800 controls the driving unit 951 of the transfer robot 950 according to the calculated offset value to correct the reference position in which the hand 954 positions the load on the loading area LA as the target position.

Referring to FIGS. 11 to 19, a process in which a substrate is aligned using a substrate alignment apparatus 2 in which the teaching apparatus 1 of FIG. 1 is employed will be described.

Figure 11:
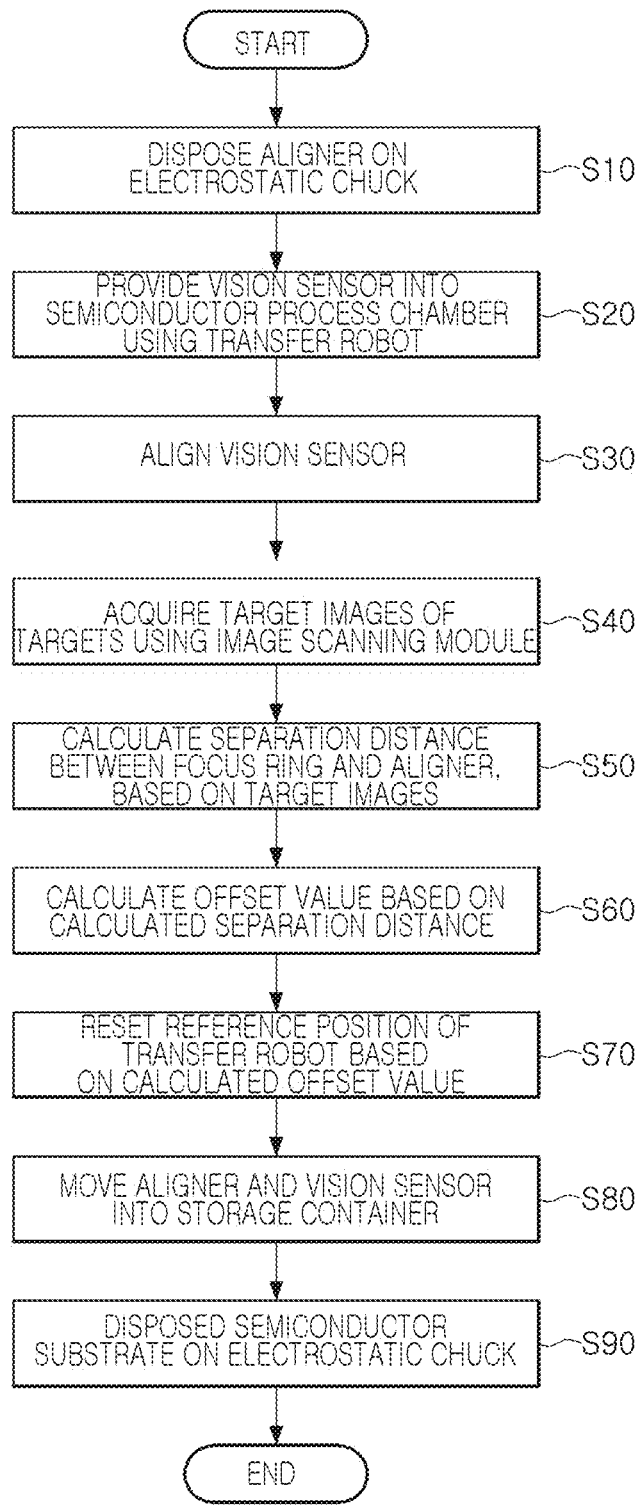
FIG. 11 is a flowchart illustrating a process of aligning a substrate using a substrate alignment apparatus according to an example embodiment.
Figure 12:
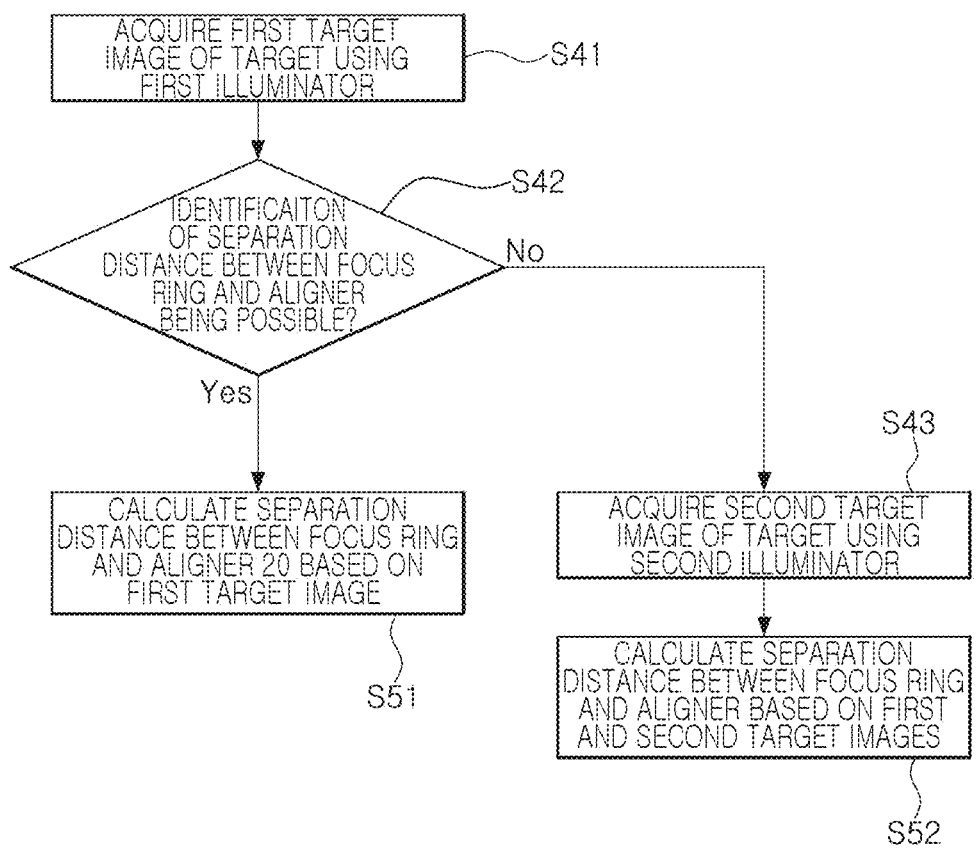
FIG. 12 is a flowchart illustrating in detail operations S40 and S50 of FIG. 11.
Figure 13:
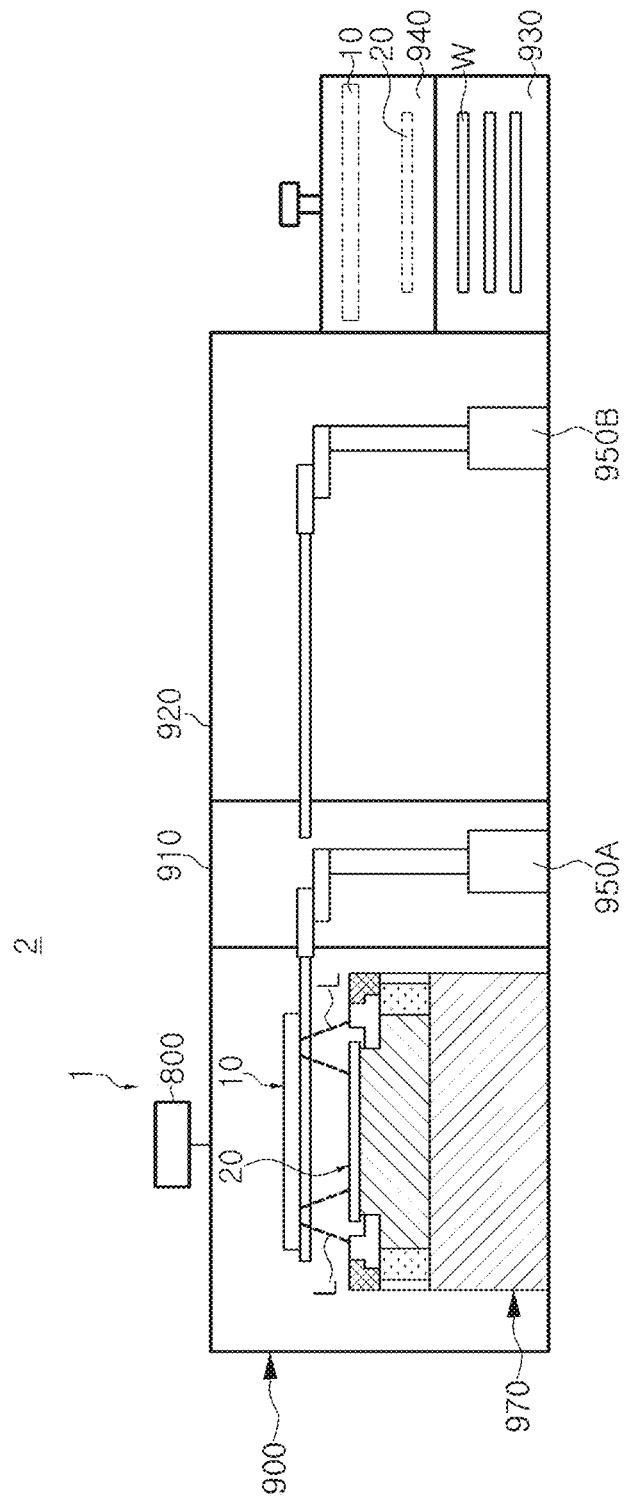
FIG. 13 is a schematic side view illustrating an example of a substrate alignment apparatus in which the teaching apparatus of FIG. 1 is employed.

FIG. 11 is a flowchart illustrating a process of aligning a substrate using a substrate alignment apparatus according to some example embodiments, and FIG. 12 is a flowchart illustrating in detail operations S40 and S50 of FIG. 11. FIG. 13 is a schematic side view illustrating an example of a substrate alignment apparatus employing the teaching apparatus of FIG. 1, and FIGS. 14 to 19 are schematic plan views illustrating a process in which a substrate is aligned by the substrate alignment apparatus of FIG. 13. Since the same reference numerals as those of FIGS. 1 to 10 have the same configuration, for brevity, a repeat of the detailed description thereof will be omitted.

Figure 14:
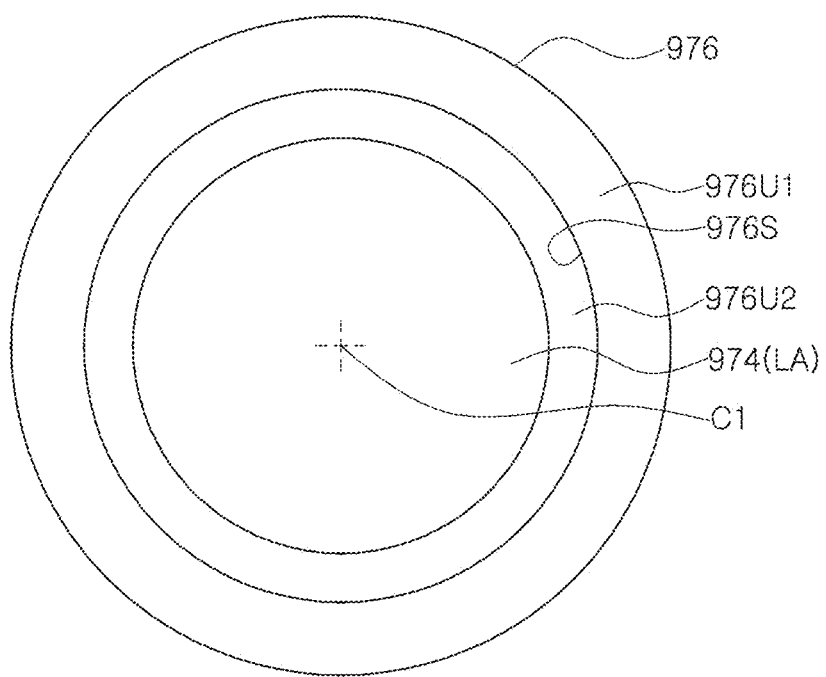
FIGS. 14 to 19 are schematic plan views illustrating a process in which a substrate is aligned by the substrate alignment apparatus of FIG. 13.

First, referring to FIG. 14, preventive maintenance for maintaining a semiconductor process chamber 900 may be performed. In the process of performing the preventive maintenance, the position of the components of the semiconductor process chamber 900 may be slightly changed. C1 denotes the center of the loading area LA located on the upper portion of the plate 974.

Figure 15:
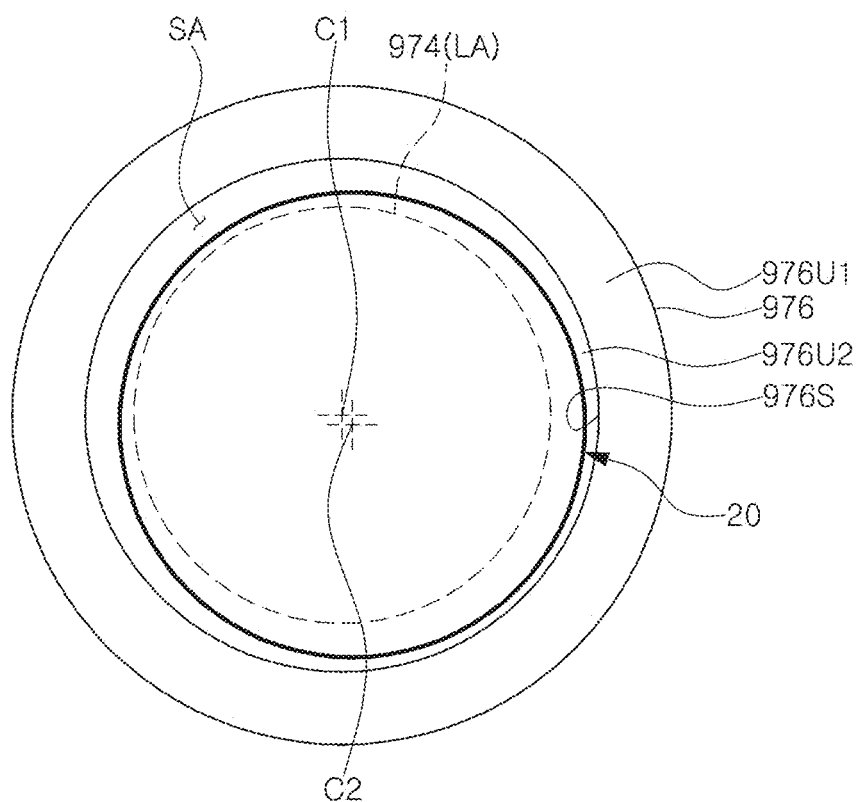

Referring to FIGS. 11, 13 and 15, the aligner 20 may be disposed on the electrostatic chuck 970 disposed inside of the semiconductor process chamber 900 of the substrate alignment apparatus 2 by the transfer robot 950 (S10). A center C2 of the aligner 20 may not match a center C1 of the loading area LA due to a minute change in positions of components of the semiconductor process chamber 900, occurring during the preventive maintenance. Accordingly, it can be seen that the separation area SA between the edge of the aligner 20 and the sidewall 976S of the focus ring 976 is not overall uniform.

The substrate alignment apparatus 2 may include the semiconductor process chamber 900, a first buffer chamber 910 connected to the semiconductor process chamber 900, a second buffer chamber 920 connected to the first buffer chamber 910, and a load port 930 connected to the second buffer chamber 920. The semiconductor process chamber 900 may be configured such that a unit process (e.g., an etching process) for manufacturing a semiconductor device is performed therein. For example, the semiconductor process chamber 900 may include the electrostatic chuck 970 disposed therein. The electrostatic chuck 970 is an example of a substrate support unit that supports a semiconductor substrate (e.g., a wafer, W) used for manufacturing a semiconductor device. Since the electrostatic chuck 970 has the same configuration as the electrostatic chuck 970 described above with reference to FIG. 1, for brevity a detailed description thereof will be omitted. The semiconductor substrate W may be seated on the plate 974 of the electrostatic chuck 970. The inside of the semiconductor process chamber 900 may be in a vacuum and/or high temperature state to perform a unit process therein. The first buffer chamber 910 and the second buffer chamber 920 may include a first transfer robot 950A and a second transfer robot 950B configured to transfer the semiconductor substrate, respectively. For example, the first transfer robot 950A and the second transfer robot 950B may have the same configuration as the transfer robot 950 described in FIG. 1. For brevity, a detailed description of the first transfer robot 950A and the second transfer robot 950B will be omitted. The operation of the first transfer robot 950A may be adjusted based on the results of the alignment process described above and/or embodiments thereof. The load port 930 in which the semiconductor substrates W are loaded may be exposed externally.

A storage container 940 in which the vision sensor 10 and the aligner 20 are loaded may be provided on the load port 930.

Figure 16:
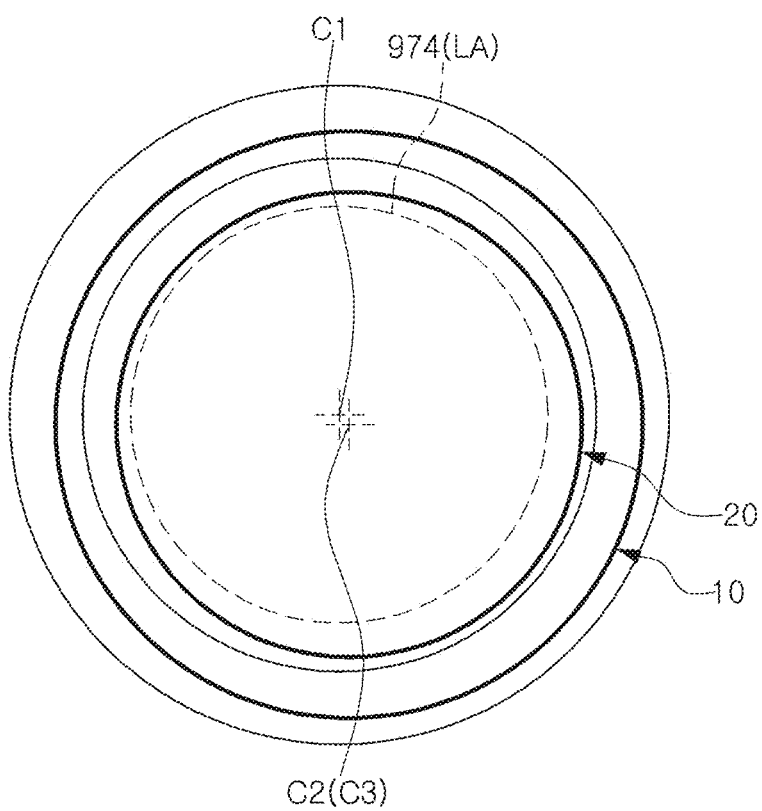
Figure 17:
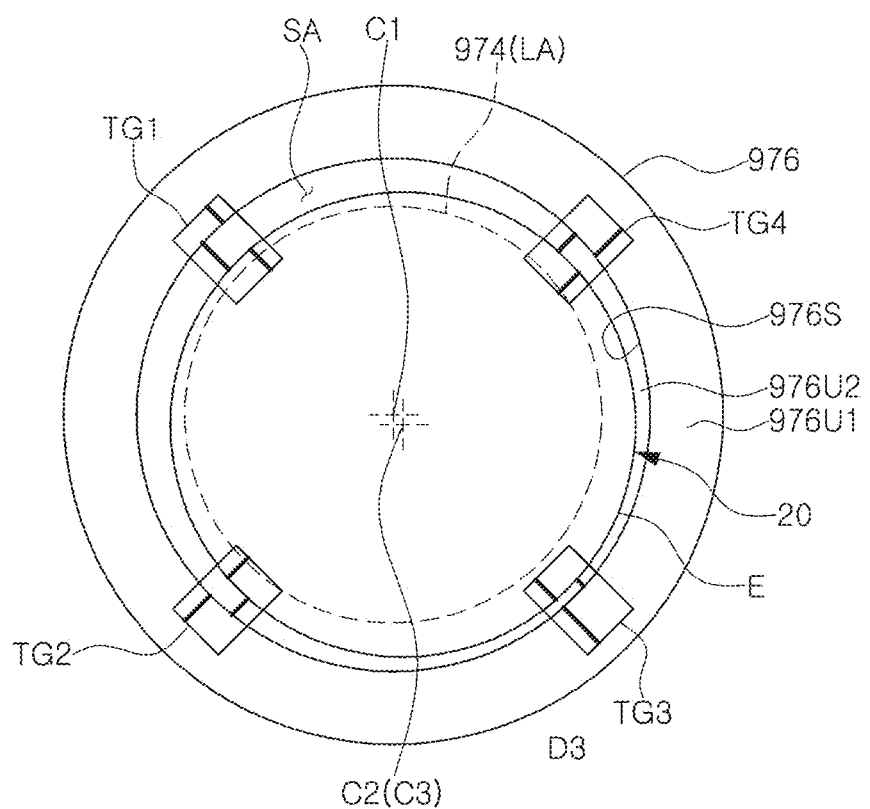
Figure 18:
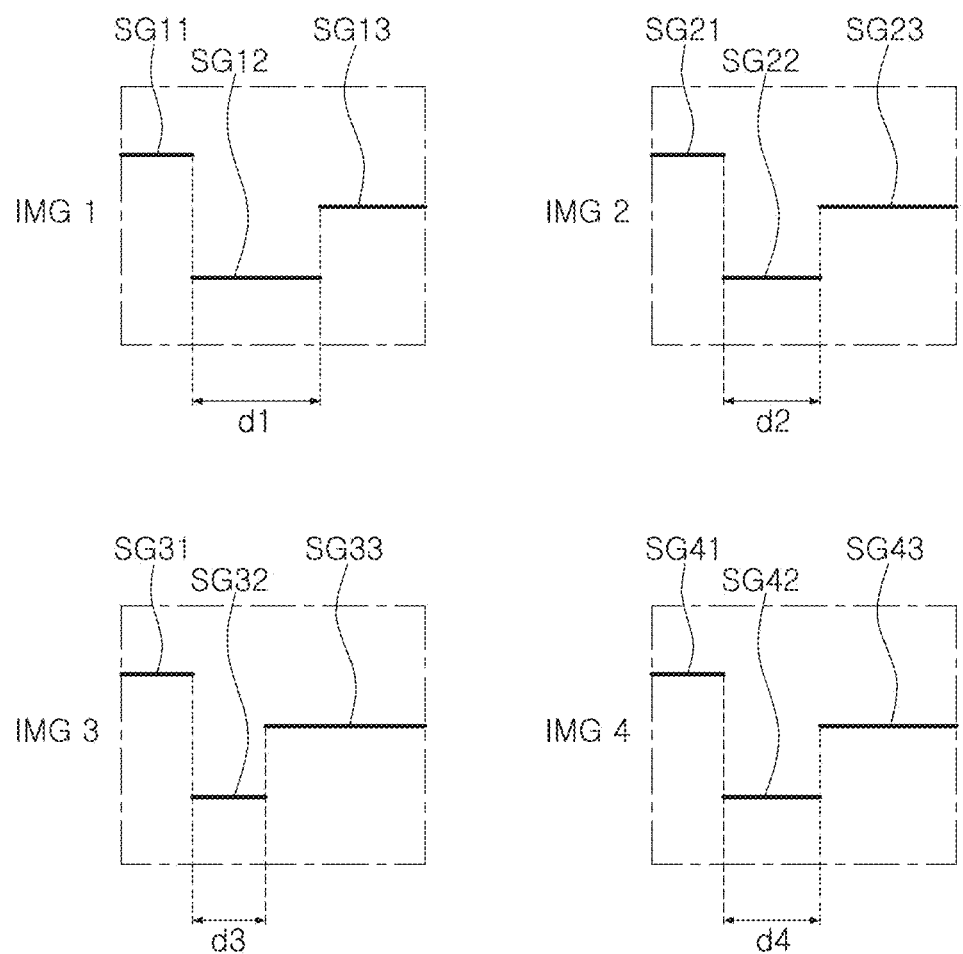

Referring to FIGS. 11, 13 and 16, the vision sensor 10 may be provided to the inside of the semiconductor process chamber 900 of the substrate alignment apparatus 2 by the transfer robot 950 (S20). The vision sensor 10 may be moved from the storage container 940 to the second buffer chamber 920 and from the second buffer chamber 920 to the first buffer chamber 910 by the second transfer robot 950B. The inside of the first buffer chamber 910 may be in a low-pressure and/or vacuum state. The vision sensor 10 may be provided from the first buffer chamber 910 into the semiconductor processing chamber 900 by the first transfer robot 950A. The semiconductor processing chamber 900 may be maintained in a vacuum and/or high temperature state. The vision sensor 10 may be disposed, for example, above the electrostatic chuck 970.

The vision sensor 10 provided in the semiconductor process chamber 900 may be aligned on a reference position (S30). The alignment of the vision sensor 10 may be aligned according to a reference position previously stored in the control unit 800. Accordingly, a center C3 of the vision sensor 10 may coincide with the center C2 of the aligner 20. Aligning the vision sensor 10 may include, for example, adjusting a horizontal position and/or a vertical position of the vision sensor 10 in the semiconductor process chamber 900, and adjusting a tilt of the vision sensor 10.

Referring to FIGS. 11, 13, 17 and 18, the first target images IMG1-IMG4 of targets TG1-TG4 may be acquired using the image scanning module 150 of the vision sensor 10 (S40). For example, the target TG may include a partial region of the aligner 20, a partial region of the focus ring 976, and a separation area SA between the edge E of the aligner 20 and the sidewall 976S of the focus ring 976. Acquiring the first target images IMG1-IMG4 may include projecting a pattern FP (e.g., a fringe pattern) onto the aligner 20 and the focus ring 976 using the first illuminator 130 of the image scanning module 150 and scanning images of the aligner 20 and the focus ring 976 on which the pattern FP is projected, using the camera 110 of the image scanning module 150. For example, the pattern FP may be divided into a plurality of segments and projected onto the first upper surface 976U1 and the second upper surface 976U2 of the focus ring 976, and the upper surface 21 of the aligner 20. For example, the first target images IMG1-IMG4 may include a fringe pattern in the form divided into first segments SG11, SG21, SG31 and SG41, second segments SG12, SG22, SG32 and SG42, and third segments SG13, SG23, SG33 and SG43, respectively (see FIG. 18).

The control unit 800 may calculate the separation distance D between the focus ring 976 and the aligner 20 based on the first target images IMG1-IMG4 (S50). For example, the processor 410 of the vision sensor 10 analyzes the shape of the pattern FP included in the first target images IMG1-IMG4, thereby calculating the separation distance D between the focus ring 976 and the aligner 20.

The control unit 800 may calculate an offset value for correcting the reference position of the transfer robot 950 based on the calculated separation distance D (S60). The offset value may include a control value for moving the hand 954 of the transfer robot 950 such that a plurality of separation distances D between the sidewall 976S of the focus ring 976 and the edge of the aligner 20 are all the same. For example, the offset value may include values for adjusting the hand 954 in a first direction (e.g., in the X-axis of FIG. 1) a second direction (e.g., in the Y-axis of FIG. 1), and/or around the center C2 of the aligner 20 and/or the center C3 of the vision sensor 10.

Figure 19:
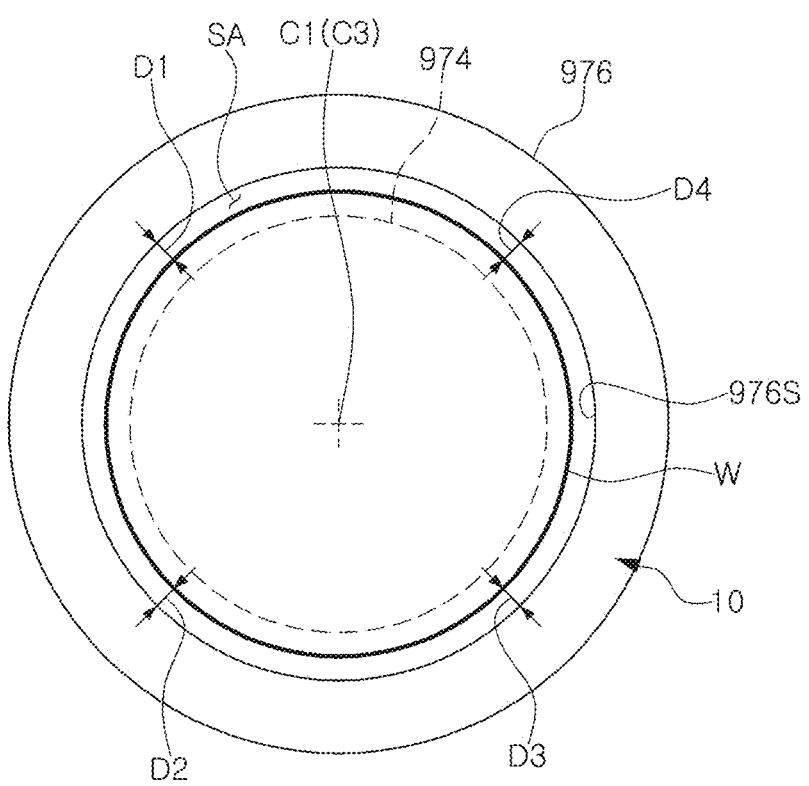

Referring to FIGS. 11, 13, and 19, the reference position of the transfer robot 950 may be reset based on the calculated offset value (S70). The control unit 800 may reset the reference position of the transfer robot 950 such that the center C3 of the vision sensor 10 coincides with the center C1 of the loading area LA.

Next, referring to FIGS. 11 and 13, the aligner 20 and the vision sensor 10 are loaded into the storage container by the transfer robot 950 (S80), and the semiconductor substrate W may be disposed on the target position of the electrostatic chuck 970 (S90).

Next, a process of manufacturing a semiconductor device may be performed on the semiconductor substrate W in the semiconductor process chamber 900.

Referring to FIG. 12, according to some example embodiments, when the focus ring 976 is formed of a material having relatively high reflectivity (such as silicon (Si)), a process of acquiring a second target image may be added.

First, a first target image of the target TG may be acquired using the first illuminator 130 (S41). Next, it may be checked whether the separation distance between the focus ring 976 and the aligner 20 is identified (S42). For example, when the reflectivity of the focus ring 976 is not relatively high and thus the position of the sidewall 976S of the focus ring 976 may be identified, the separation distance D between the sidewall 976S of the focus ring 976 and the edge E of the aligner 20 may be calculated (S51). On the other hand, when the reflectivity of the focus ring 976 is relatively high and the position of the sidewall 976S of the focus ring 976 cannot be identified (and/or is unclear), the second target image may be obtained using the second illuminator 140 (S43).

The control unit 800 may calculate the separation distance D between the sidewall 976S of the focus ring 976 and the edge E of the aligner 20 based on the first and second target images (S52). For example, the position of the sidewall 976S of the focus ring 976 may be identified through the second target image and referring to the edge E of the aligner 20 identified in the first target image, the separation distance D between the sidewall 976S of the focus ring 976 and the edge E of the aligner 20 may be calculated.

As set forth above, a teaching apparatus according to some example embodiments may adjust (and/or readjust) a reference position of a transfer robot by reflecting minute position changes of parts in a process chamber.

A substrate alignment apparatus according to some example embodiments may seat a substrate on a target position in a process chamber by reflecting minute changes in positions of components in a process chamber.

While some example embodiments have been illustrated and described above, it will be apparent to those skilled in the art that modifications and variations could be made without departing from the scope of the present inventive concepts as defined by the appended claims.

What is claimed is:

1. A teaching apparatus comprising:
   a chamber;
   an electrostatic chuck in the chamber, the electrostatic chuck including a sidewall surrounding a loading area;
   an aligner configured to be loaded onto the loading area of the electrostatic chuck;
   a vision sensor configured to obtain measurement data by measuring separation distances of separation regions between the aligner and the sidewall of the electrostatic chuck and to transmit the measurement data;
   a transfer robot configured to load the aligner onto a reference position of the loading area and to position the vision sensor above the electrostatic chuck; and
   a controller configured to reset the reference position and to equalize the separation distances based on the measurement data transmitted from the vision sensor.

2. The teaching apparatus of claim 1, wherein the vision sensor is further configured to, respectively, project a pattern to the separation regions, acquire target images based on the projected patterns, and calculates the separation distances based on the target images.

3. The teaching apparatus of claim 2, wherein the vision sensor includes:
a support member;
a plurality of image scanning assemblies on the support member, the plurality of image scanning assemblies configured to acquire the target images; and
a control system on the support member.

4. The teaching apparatus of claim 3, wherein the control system includes:
a processor configured to receive the target images from the plurality of image scanning assemblies and to generate the measurement data based on the target images; and
a wireless communication interface configured to transmit the measurement data generated by the processor to the controller.

5. The teaching apparatus of claim 3, wherein the plurality of image scanning assemblies each include:
a first illuminator configured to project the pattern onto targets; and
a camera configured to acquire the target images by scanning the targets on which the pattern is projected.

6. The teaching apparatus of claim 5, wherein the first illuminator includes:
a laser light source configured to emit laser light; and
an optical member configured to control an optical path of the laser light, and
wherein the pattern is projected onto the targets by the laser light.

7. The teaching apparatus of claim 3, further comprising:
a second illuminator configured to irradiate light onto targets.

8. The teaching apparatus of claim 1, wherein the aligner has a wafer shape.

9. The teaching apparatus of claim 8, wherein an upper surface of the aligner is blasting-processed.

10. The teaching apparatus of claim 8, wherein
an upper surface of the aligner includes a marker, and
the marker has a reflectivity lower than a reflectivity of the upper surface.

11. The teaching apparatus of claim 1, wherein
the controller is further configured to calculate an offset value based on the measurement data transmitted from the vision sensor, and
wherein the reset of the reference position of the transfer robot is based on the offset value.

12. A teaching apparatus comprising:
a substrate support assembly, the substrate support assembly including a sidewall surrounding a loading area;
an aligner configured to be loaded onto the loading area;
a vision sensor configured to obtain measurement data by measuring separation distances between the aligner and the sidewall of the substrate support assembly and to transmit the measurement data;
a transfer robot configured to load the aligner into the loading area and to position the vision sensor above the loading area; and
a controller configured to correct a reference position of the transfer robot based on the measurement data transmitted from the vision sensor.

13. The teaching apparatus of claim 12, wherein the substrate support assembly is an electrostatic chuck.

14. The teaching apparatus of claim 13, wherein the electrostatic chuck includes:
a plate, the plate including the loading area; and
a focus ring on a circumference of the plate, the focus ring including the sidewall.

15. The teaching apparatus of claim 14, wherein an upper surface of the focus ring includes:
a first upper surface at a first level higher than an upper surface of the aligner; and
a second upper surface at a second level lower than the upper surface of the aligner.

16. The teaching apparatus of claim 12, wherein the transfer robot is configured to load the aligner such that a center of the aligner and a center of the vision sensor overlap each other.

17. A substrate alignment apparatus comprising:
a chamber including an interior space, the chamber configured to process a substrate in the interior space;
a substrate support assembly in the interior space, the substrate support assembly including a sidewall surrounding a loading area;
an aligner configured to be loaded onto the loading area;
a vision sensor configured to obtain measurement data by measuring separation distances between the aligner and the sidewall and to transmit the measurement data;
a transfer robot configured to load and unload the aligner, the vision sensor, and the substrate into and out of the interior space; and
a controller configured to correct a reference position for the loading of the substrate into the loading area by teaching the transfer robot based on the measurement data transmitted from the vision sensor.

18. The substrate alignment apparatus of claim 17, wherein the aligner has the same shape and weight as the substrate.

19. The substrate alignment apparatus of claim 18, wherein the substrate is a wafer.

20. The substrate alignment apparatus of claim 17, wherein the loading and unloading of the aligner, the vision sensor, and the substrate into and out of the interior space includes:
loading the aligner into the loading area,
disposing the vision sensor above the aligner,
sequentially unloading the aligner and the vision sensor, and
loading the substrate into the loading area after the vision sensor has been unloaded.

* * * * *